United States Patent [19]

Boni et al.

[11] 4,081,900
[45] Apr. 4, 1978

[54] METHOD OF FORMING COVERS FOR ELECTRICAL EQUIPMENT

[75] Inventors: Richard R. Boni, McMurray; Joseph J. Janubetz, Canonsburg, both of Pa.

[73] Assignee: McGraw-Edison Company, Elgin, Ill.

[21] Appl. No.: 728,501

[22] Filed: Sep. 30, 1976

[51] Int. Cl.² ........................................... H01B 13/00
[52] U.S. Cl. ................... 29/624; 174/35 CE; 228/125; 228/155; 228/170; 228/174
[58] Field of Search ............ 29/602 R, 624, DIG. 48; 228/155, 170, 174, 162, 125, 184; 174/35 CE

[56] References Cited

U.S. PATENT DOCUMENTS 2,718,542  9/1955  Lapsley ........................... 174/35 CE

FOREIGN PATENT DOCUMENTS 312,615  11/1933  Italy ................................ 174/35 CE
289,957  5/1928  United Kingdom ............ 174/35 CE

OTHER PUBLICATIONS

"Influence of Flux on Circuit-Breaker Top Design," The Electric Journal, vol. XXVI, No. 6, June 1928.

*Primary Examiner*—Victor A. Dipalma
*Attorney, Agent, or Firm*—Jon Carl Gealow; Thomas E. McDonald; Ronald J. LaPorte

[57] ABSTRACT

A method for forming an electrical equipment cover, whose temperature will not appreciably increase when used in an environment of high-strength, time-varying magnetic fields, is provided. The cover is formed from a strong, relatively inexpensive magnetic steel which would ordinarily become heated in such an environment by hysteresis and eddy current losses. In order to prevent this heating, a circular blank or disk of this steel is determined and cut. Selected segments of the blank are removed to form slots in a polygonal pattern concentric with the disk and to form slots along a diameter of the disk or circular blank. All of the slots are filled with strips of a non-magnetic metal, preferably of low electrical resistance, which are then welded to the disk or circular blank. The welds are then ground to smooth the surface of the circular blank. Openings for current-carrying bushings are established in the blank to connect ends of adjacent slots. The cover is then formed and the current-carrying bushings are attached.

7 Claims, 9 Drawing Figures

METHOD OF FORMING COVERS FOR ELECTRICAL EQUIPMENT

BACKGROUND OF THE INVENTION

1. Field of the Invention

The invention relates generally to the forming of electrical equipment covers, and more particularly, this invention relates to a method of forming electrical equipment covers containing non-magnetic material to resist heating induced by the presence of varying magnetic fields.

2. Description of the Prior Art

It has long been known that magnetic fields surround wires carrying electric currents and that these fields can affect the functioning and properties of nearby materials. It has also been known that the magnetic fields which surround changing electric currents, such as alternating current, are themselves changing, and that these changing magnetic fields, sometimes called time-varying, produce somewhat different effects than static fields. In particular, it has been long known that time-varying magnetic fields can produce heating in certain metals. Two phenomena are involved — hysteresis and eddy current losses.

When a time-varying magnetic field contacts an electrical conductor, be the conductor magnetic or not, the field excites the electrons, causing them to move, thus producing an electric current. This electric current produces more or less heat, depending upon the electrical properties of the conductor carrying it. Since these induced currents tend to travel in circles, the name eddy currents has been used to describe them, but the term Foucault current is also commonly used.

The second phenomenon involved in the heating of magnetic conductors in a time-varying magnetic field is the hysteresis effect. A magnetic conductor is described in terms of a plurality of magnets. The presence of a magnetic field causes these magnets to align themselves in the direction of the field, thus causing disturbances in the interior of the conductor. When the magnetic field is constantly reversing, as is the case when it is produced by alternating current, the numerous magnets are also constantly reversing to align themselves with the field. This constant alignment process results in the retention of energy (hysteresis) and is the source of the heat perceived when a magnetic conductor is surrounded by a time-varying magnetic field.

While the existence of eddy current and hysteresis losses are known, the precise measurement of these effects is extremely difficult. For example, in the attempt to measure exactly the amount of heat produced by eddy currents, the so-called "eddy current anomaly" was discovered, in which the heat produced, for no apparent reason, often exceeded that predicted. Similarly, when both eddy currents and hysteresis are at work, it has proved difficult to determine the share of the heat produced by each, and thus difficult to determine whether the heating is due to the electrical or magnetic properties of the metal. Furthermore, it is known that the nature of the two phenomena is significantly affected by the geometrical shape of the material, by the composition of the material, and by any boundaries where dissimilar materials meet.

In any event, the heating resulting from eddy currents and hysteresis effects creates problems in several respects. For one thing, it can weaken the heated material during the period of temperature increase, as well as destroying the benefits of tempering the material. Further, the heating can cause the material to expand and distort, possibly dislocating components whose stationary position is important (e.g., current-carrying bushings). The heating can also adversely affect the electromagnetic properties of the material itself, properties such as its resistance and reluctance. In addition, the eddy currents can induce their own magnetic fields, which can cause interference in nearby electrical circuits. Still further, the heated material may be a tank containing an electrical component surrounded by an insulating fluid such as oil, which is the situation in which the preferred embodiment of this invention is utilized. The heat causes thermal decomposition of the oil with an accompanying alteration in its insulating properties, with the result that it must be replaced.

In attempting to obviate the problems of heating, prior inventors have attempted to minimize the eddy current and hysteresis losses. Thus, one solution has been to arrange the magnetic fields so that they are equal but opposite in direction so that they cancel each other. Another solution has been to tolerate the heat produced, but to direct it away from critical areas by using metals having good heat conductivity. Another has been to employ shields of materials which are themselves non-magnetic and thus resistant to hysteresis heating. Some of these metals are also relatively impermeable to magnetic fields, and this feature has been used to provide a shield which does not itself become heated and which also cuts off magnetic fields from reaching vulnerable components. It will be noted that these solutions rely on three methods of operation: they remove the magnetic fields by cancellation or shielding, or they remove the heat produced, or they use a non-magnetic material which is not heated by hysteresis.

With specific reference to covers for electrical equipment, such as circuit breakers and transformers, two basic approaches have been utilized in the past. One has been to construct the cover completely from non-magnetic material, such as a non-magnetic stainless steel. While this approach resolves the hysteresis and eddy current problems stemming from magnetic fields, such non-magnetic material is quite expensive relative to ferromagnetic structural materials that would otherwise be utilized. Accordingly, the expense of this approach renders it prohibitive for most larger electrical equipment situations.

The other approach that has been employed is to construct the casing of the lower cost ferromagnetic material (e.g., low carbon steel), and then replace portions of the ferromagnetic material with strips of non-magnetic material. This is accomplished by cutting slots in the cover which extend between openings provided in the cover for the attachment of current-carrying bushings, the strips of non-magnetic material being located in the slots. By use of this approach, the magnetic fields producing the eddy current and hysteresis effects encounter a high reluctance, which considerably reduces the heating of the cover produced by the magnetic field.

While this latter approach greatly reduces the hysteresis and eddy current losses at a relatively low cost, it involves other problems. Past methods of installing the strips of non-magnetic material have involved cutting the slots in the casing and welding the strips to the casing after it was formed. This welding of the already formed casing produced distortion thereof. Since there are close tolerances for the bushings in order to accurately align the contacts and to provide a desired seal, the distortion resulting from the welding creates problems. To overcome these problems, it has been necessary to employ adjustable bushings to correct for the misalignments resulting from distortion of the casing.

SUMMARY OF THE INVENTION

To obviate the problems of prior art casings having non-magnetic strips located therein, the method of this invention was developed. Basically, the method hereof involves locating the non-magnetic strips in the casing material prior to forming the casing.

This is accomplished in the preferred embodiment disclosed herein by forming a circular blank or disk of magnetic steel, such as a low carbon steel, and then removing selected segments of magnetic steel from the disk and inserting strips of non-magnetic material, such as a non-magnetic stainless steel in the resulting slots. The slots are formed in a polygonal shape concentric with the disk, each of the slots extending between areas of magnetic steel to be removed to form openings for the attachment of current-carrying bushings. Additional slots and non-magnetic strips are located along a diameter of the disk. Cutting of the slots may be achieved in any appropriate fashion, such as by the use of a torch.

The non-magnetic material placed in the slots preferably also has good electrical conductivity, (although not necessarily, as the stainless steel used in this particular preferred embodiment is not one of the better conductors). Strips or bars of the non-magnetic stainless steel of the same thickness and size as the slots are welded into the slots. This welding provides a unitary structure, followed by suitable grinding or milling to smooth out the finish on the surface of the circular blank or disk. Then the disk can be formed into its final shape, which is nearly hemispherical in the preferred embodiment. The openings for the current-carrying bushings may be established by removing the magnetic steel in the designated areas either immediately preceding or subsequent to forming the casing. However, in the preferred embodiment of this invention, the openings are pierced into the casing after forming. The openings should be of a diameter sufficient to remove all of the blank or disk material between the ends of slots, so that the slots filled with non-magnetic material completely separate adjacent portions of the circular blank.

The method of formation of electrical equipment covers taught herein overcomes the deficiencies of prior art electrical equipment cover construction. By welding the non-magnetic strips into the blank before forming, distortion by welding after forming is avoided and the critical positioning of electrical contacts on the bushings is maintained without the necessity of providing for adjustments of the bushings. Thus, the method of this invention permits the utilization of the less expensive structure of a ferromagnetic casing with non-magnetic strips located therein, but without the distortion problems and the requirement of adjustable bushings found in connection with prior art structures.

These and other objects, advantages and features of this invention will hereinafter appear, and for purposes of illustration, but not of limitation, an exemplary embodiment of the subject invention is shown in the appended drawing.

DETAILED DESCRIPTION OF THE PREFERRED EMBODIMENT

Figure 1:
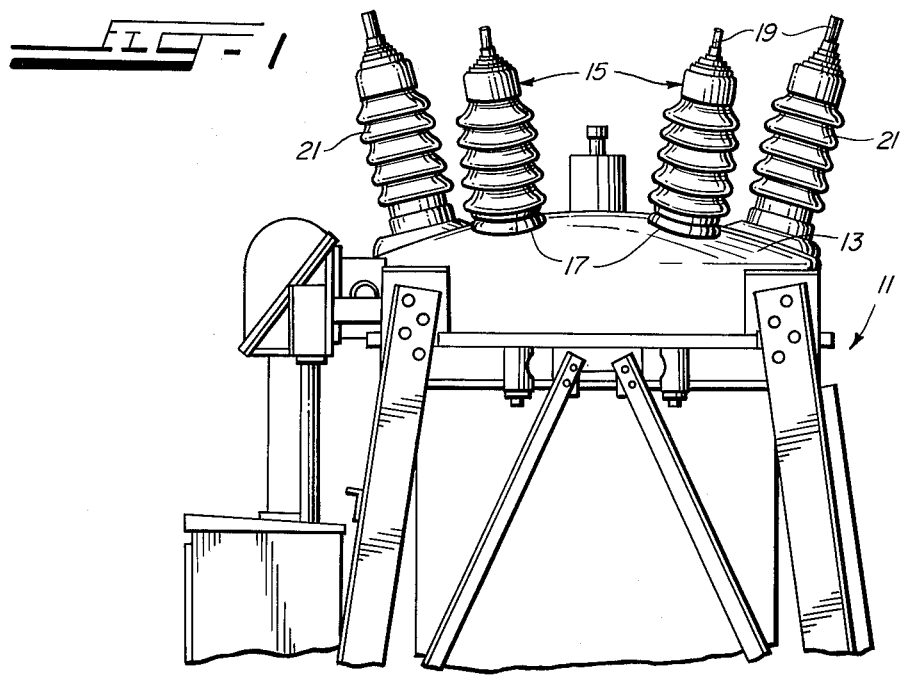
FIG. 1 is a side elevational view of an electrical equipment casing constructed in accordance with the method of this invention.

A preferred embodiment of an electrical equipment casing 11 having a cover 13 formed in accordance with the method of this application as illustrated in FIG. 1. While this invention has applicability to many different types of electrical equipment casings, such as transformer casings, the particular preferred embodiment illustrated in FIG. 1 is that of a circuit breaker.

A plurality of current-carrying bushings 15 are attached to casing cover 13 at openings 17. Any desired number of bushings 15 may be utilized, but in this preferred embodiment, a total of six current-carrying bushings 15 are employed. Each of the bushings 15 includes a current-carrying conductor 19 encased in an insulating structure 21.

Figure 2:
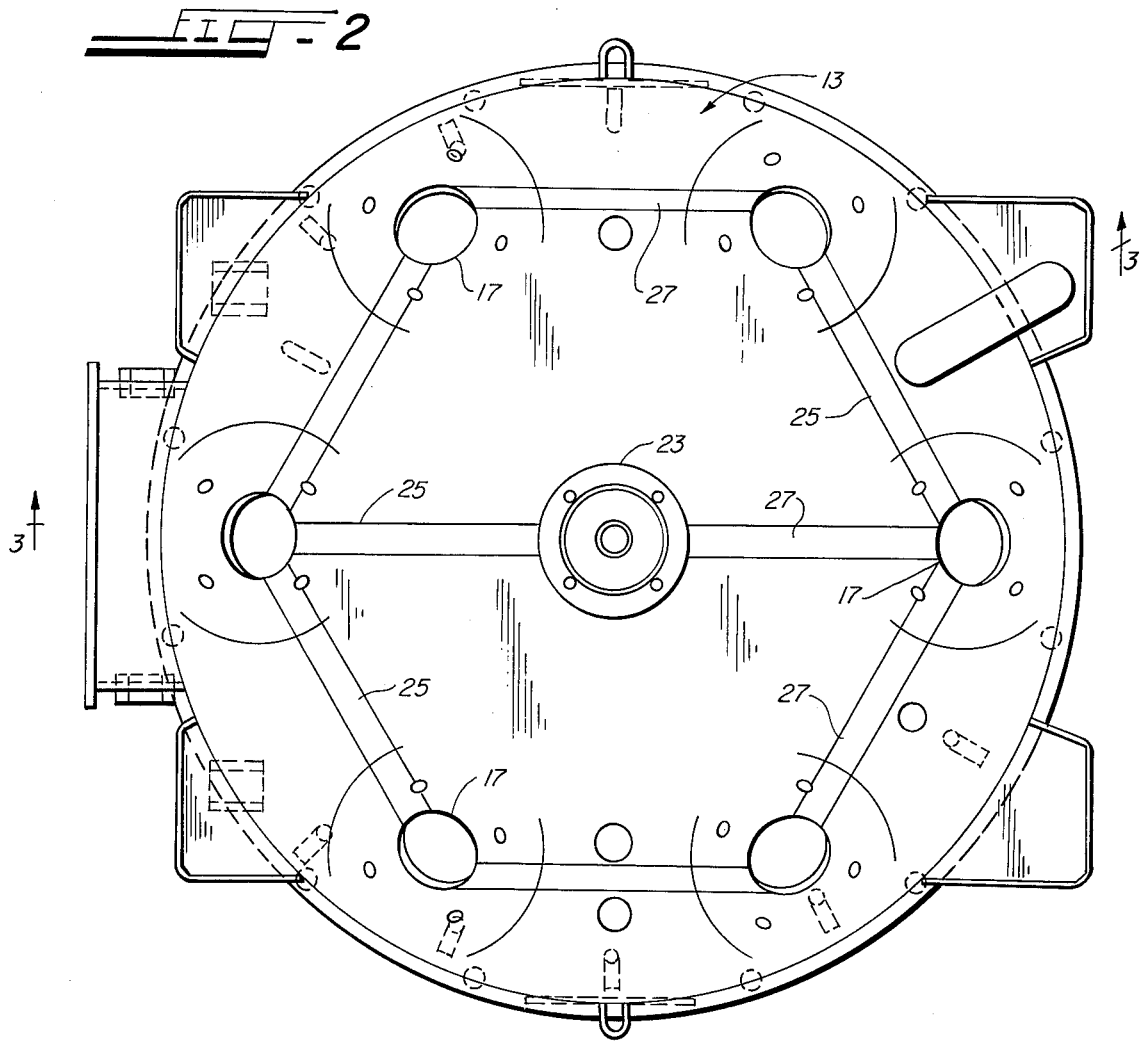
FIG. 2 is an enlarged top plan view of the casing of FIG. 1 with the bushings removed.

As illustrated in FIG. 2, it is desirable to interconnect openings 17, as well as a central mounting opening 23, with a plurality of slots 25. Each of the slots 25 contains a strip of non-magnetic material 27. Thus, a polygonal form concentric with the casing cover is formed by the outer slots 25, while additional slots are formed along the diameter of the cover 13. With this pattern of slots 25 containing the non-magnetic material 27, any magnetic flux path of substantial length through the magnetic material of casing cover 13 encounters the non-magnetic material 27, which increases the reluctance of that magnetic flux path. This increased reluctance to the magnetic field results in an approximate 80% decrease of the eddy current and hysteresis heating losses in the cover 13. At the same time, the cost of the casing cover 13 is considerably less than that of a casing cover formed entirely from non-magnetic material.

However, the prior art method of forming such a casing cover involves welding the non-magnetic material 27 to the casing cover 13 after the cover had already been formed. The heat generated by this welding would distort the casing cover and cause misalignment of contacts carried by the bushings 15. Accordingly, some method of adjusting the bushings 15 would have to be provided, which adversely affects the reliability of the electrical equipment, as well as requiring considerable effort to appropriately ajust the bushings to compensate for distortions caused by the heat of welding.

Figure 4:
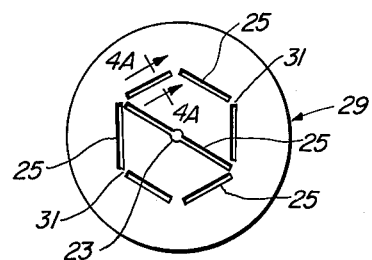
FIG. 4 is a schematic plan view of a circular blank utilized in constructing the casing of FIGS. 1-3.
Figure 4A:
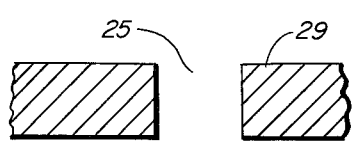
FIG. 4A is a partial cross-sectional view taken along line 4A—4A of FIG. 4.
Figure 5:
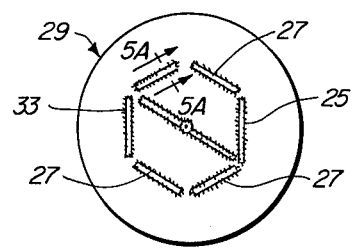
FIG. 5 is a schematic plan view of the circular blank of FIG. 4 after additional steps have been performed.
Figure 6:
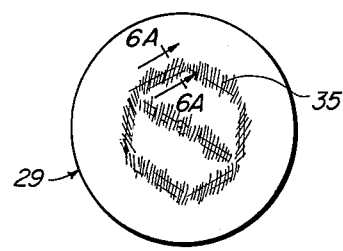
FIG. 6 is a schematic plan view of the circular blank of FIG. 4 immediately prior to forming the casing.
Figure 3:
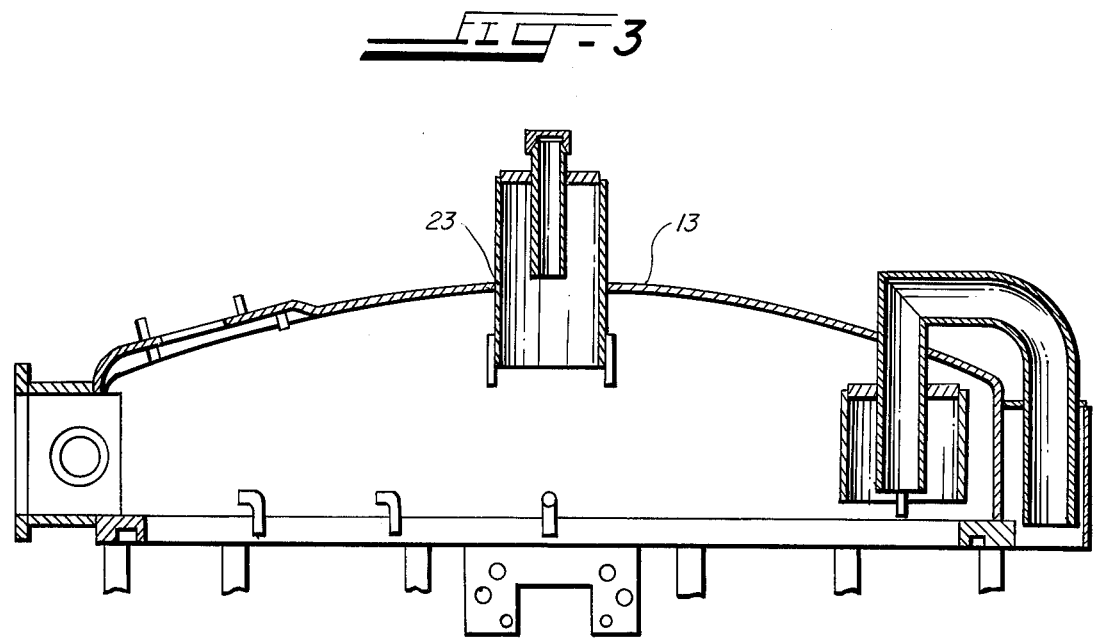
FIG. 3 is a cross-sectional view taken along line 3—3 of FIG. 2.

Applicant has overcome these problems of the prior art method of forming a casing cover of the type illustrated in FIGS. 1-3 by utilizing the method steps schematically illustrated in FIGS. 4-6. With reference first to FIG. 4, it may be seen that a circular blank or disk 29 of the size required to form a casing cover 13 is determined and cut from a sheet of suitably strong material. As a specific example, a low carbon steel may be utilized for the material of the casing cover. Since the relatively inexpensive low carbon steel is also ferromagnetic, it is necessary to increase the reluctance of the magnetic flux path as discussed in connection with FIG. 2. This is achieved by removing selected segments of the material of blank 29 to form slots 25. As shown by the cross-sectional view of FIG. 4A, these slots extend completely through a circular blank or disk 29. It may be noted that the slots 25 extend between areas 31 from which the material will be removed to form the openings 17 for bushings 15, as well as to the mounting opening 23 which is already established in blank 29. Slots 25 may be cut in the material of blank 29 by any appropriate method, such as the use of an acetylene torch.

Figure 5A:
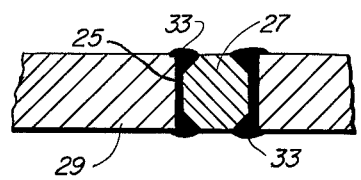
FIG. 5A is a partial cross-sectional view taken along line 5A—5A of FIG. 5.

In FIG. 5 the non-magnetic material 27 has been located in slots 25. An example of a type of non-magetic material that may be utilized is an appropriate stainless steel. The strips of non-magnetic material 27 fit into slots 25 with a 1/16 inch clearance. The edges of non-magnetic strips 27 are beveled, and the blank 29 is clamped along the circumference and its center to minimize warping during the welding process. To further minimize the tendency to warp during welding, strips 27 are not welded in by progressing in a circular fashion around the blank 29, but instead a sequence of welding is employed in which each subsequent weld step is carried out as close as possible to the opposite side of the blank or disk 29. The weld bonds 33 extend upward over the surface of the blank 29, as illustrated in FIG. 5A.

Figure 6A:
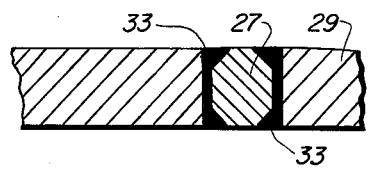
FIG. 6A is a partial cross-sectional view taken along line 6A—6A of FIG. 6.

After the welding has been completed, the extending welds 33 are ground or milled down, as schematically illustrated by the scratch lines 35 in FIG. 6. Also, as may be seen in FIG. 6A, the welds 33 are now even with the surface of blank 29, so that a relatively smooth surface is provided.

The blank or disk 29 with the non-magnetic strips 27 welded therein is now formed into the casing cover 13. In order for the forming to be successful without breaking the welds 33 between the non-magnetic strips 27 and the blank 29, it is necessary that the non-magnetic material strip 27 and the material of blank or disk 29 have similar forming characteristics. In addition, the materials should bond well to one another. These characteristics are met by the low carbon steel and non-magnetic stainless steel referred to herein.

It should be understood that various modifications, changes and variations may be made in the arrangement, operation and details of construction of the elements disclosed herein without departing from the spirit and scope of this invention.

We claim:

1. A method of forming a cover for an electrical equipment casing comprising the steps of:
   determining a portion of flat sheet material having a relatively high magnetic permeability to be utilized in constructing the cover;
   replacing selected segments of said portion with material having low magnetic permeability; and
   forming the cover from said portion after replacement of said segments without distortion of the cover.

2. A method as claimed in claim 1 wherein said replacing step comprises:
   removing said selected segments of said portion to form slots in said portion;
   inserting strips of said material having high electrical conductivity and low magnetic permeability in said slots; and
   welding said strips to said portion.

3. A method as claimed in claim 2 and further comprising the step of smoothing the surface of said portion after said welding step has been completed.

4. A method of forming a cover for an electrical equipment casing comprising the steps of:
   cutting a circular blank of low carbon steel from which the cover is to be formed;
   removing selected segments of said low carbon steel to form slots extending between areas to be removed for the insertion of current-carrying bushings; p1 inserting strips of non-magnetic stainless steel in said slots to limit heating of the cover by increasing the reluctance of magnetic flux paths in the cover;
   welding said strips of stainless steel to said low carbon steel;
   grinding the weld joints to smooth the surface of said circular blank;
   removing said areas to provide openings for said current-carrying bushings;
   forming the cover from said circular blank to provide the dimensional accuracy and stability of a cold formed part; and
   attaching said current-carrying bushings to the cover.

5. A method as claimed in claim 4 wherein said welding step comprises welding generally opposing strips in sequence to preclude warping of said blank.

6. A method as claimed in claim 4 wherein said removing step is achieved by cutting out the material being removed with a torch.

7. A method for manufacture of a curved shape capable of use in an environment exposed to time-varying magnetic fields, without substantial increase in temperature due to said fields, and comprising the steps of:
   forming a disk of ferromagnetic sheet material;
   removing selected segments of said ferromagnetic material to form slots through said disk along a pattern which is polygonal and concentric with the disk;
   removing selected segments of said ferromagnetic material to form slots along a diameter of the disk;
   filling said slots with a non-magnetic material of low electrical resistance;
   fastening said non-magnetic material to said disk by welding;
   grinding said welds to smooth the surface of said disk;
   forming said disk into the curved shape; and
   removing all areas of said ferromagnetic material located in the path described by said polygon.

* * * * *

UNITED STATES PATENT AND TRADEMARK OFFICE
CERTIFICATE OF CORRECTION

PATENT NO. : 4,081,900
DATED : April 4, 1978
INVENTOR(S) : Richard R. Boni, Joseph J. Jakubetz It is certified that error appears in the above-identified patent and that said Letters Patent are hereby corrected as shown below:

Inventors: Joseph J. Janubetz should be --Joseph J. Jakubetz--

*Signed and Sealed this*

*Twenty-eighth* Day of *August 1979*

[SEAL]

*Attest:*

*Attesting Officer*

LUTRELLE F. PARKER
*Acting Commissioner of Patents and Trademarks*